(12) United States Patent
Beukert et al.

(10) Patent No.: US 11,909,398 B2
(45) Date of Patent: Feb. 20, 2024

(54) LABORATORY EQUIPMENT WITH FLAMMABLE REFRIGERANT

(71) Applicant: Eppendorf SE, Hamburg (DE)

(72) Inventors: Uwe Beukert, Hamburg (DE); Falk Binder, Hamburg (DE)

(73) Assignee: Eppendorf SE, Hamburg (DE)

( * ) Notice: Subject to any disclaimer, the term of this patent is extended or adjusted under 35 U.S.C. 154(b) by 0 days.

(21) Appl. No.: 17/993,327

(22) Filed: Nov. 23, 2022

(65) Prior Publication Data

US 2023/0163752 A1 May 25, 2023

(30) Foreign Application Priority Data

Nov. 25, 2021 (EP) ..................................... 21210624

(51) Int. Cl.

| | |
|---|---|
| *G01R 31/327* | (2006.01) |
| *H03K 3/2893* | (2006.01) |
| *B01L 7/00* | (2006.01) |
| *H01H 43/02* | (2006.01) |
| *H03K 17/06* | (2006.01) |

(52) U.S. Cl.
CPC .............. *H03K 3/2893* (2013.01); *B01L 7/00* (2013.01); *G01R 31/327* (2013.01); *H01H 43/02* (2013.01); *H03K 17/06* (2013.01); *B01L 2300/1894* (2013.01)

(58) Field of Classification Search
CPC .. H03K 3/2893; H03K 17/06; H03K 17/6871; B01L 7/00; B01L 2300/1894; G01R 31/327; G01R 31/3271; G01R 31/3272; G01R 31/3274; G01R 31/3275; G01R 31/333; G01R 31/3333; H01H 43/02; H01H 9/167; H01H 47/002; H01H 9/16
See application file for complete search history.

(56) References Cited

U.S. PATENT DOCUMENTS

2019/0204388 A1  7/2019  Hamamoto
2019/0310300 A1* 10/2019 Kawamura ........ H03K 17/6871

FOREIGN PATENT DOCUMENTS

JP          2013219955 A     10/2013

* cited by examiner

*Primary Examiner* — Jung Kim
(74) *Attorney, Agent, or Firm* — Downs Rachlin Martin PLLC

(57) ABSTRACT

Laboratory equipment with flammable refrigerant and connected to at least two different electrical potentials for supplying the equipment with electrical energy. An electrical switch arrangement has first and second switches for electrical separation from, respectively, the first and second potentials. A sequence controller switches on the first switch and thereafter the second switch. A monitoring device is connected via a first contact on the equipment side to the first switch and via a second contact on the mains side to an electrical potential other than the first electrical potential for detecting a switched-on state of the first switch and signaling the detection to the sequence controller. When the monitoring device signals a switched-on state, the sequence controller blocks operation of the equipment as a function of the signaled switched-on state and whether the first switch is expected to be switched on or switched off.

15 Claims, 5 Drawing Sheets

LABORATORY EQUIPMENT WITH FLAMMABLE REFRIGERANT

RELATED APPLICATION DATA

This application claims the benefit of priority of EP21 210 624.9 filed on Nov. 25, 2021, which is incorporated by reference herein in its entirety.

FIELD OF THE DISCLOSURE

The invention relates to an item of laboratory equipment with flammable refrigerant and to a method for operating and a method for producing such an item of laboratory equipment.

BACKGROUND

Cooled laboratory equipment, in particular laboratory apparatus or devices, such as cooled laboratory centrifuges or laboratory refrigeration equipment, must meet various safety requirements. The standard DIN EN 61010-2-011, for example, specifies safety requirements for electrical measuring, control, and laboratory equipment. In particular, the intention is to ensure that the configuration and the construction of refrigeration equipment provides adequate protection against certain hazards for users, bystanders, trained service personnel and the surrounding areas, moreover against the specific hazards that may originate from cooled systems.

In the standard DIN EN 378, the life cycle of refrigerating systems is considered, especially with regard to system/appliance safety, but also, for example, with regard to installation areas of the systems, limit values of refrigerants or the protection of persons in cold rooms. The standard deals in particular with the flammability classes 1 (no flame spread), 2 L (mildly flammable), 2 (flammable) and 3 (highly flammable) for refrigerants, which are defined in the ISO 817 standard. Examples of refrigerants are, for example: propane, (iso)butane (flammability class 3); R152a (flammability class 2); R1234yf (flammability class 2 L); R410A, R22 (flammability class 1).

Highly flammable hydrocarbons, especially propane and (iso)butane, have favorable environmental properties. For example, the ozone depletion potential ("ODP") value for each of the refrigerants mentioned is zero, and the global warming potential ("GWP") or CO2 equivalent is only three.

It is desirable to use refrigerants having favorable environmental properties in today's refrigerated laboratory equipment. With regard to the mentioned refrigerants propane and (iso)butane, extended safety precautions are necessary. In particular, safe spaces are necessary inside the machine or equipment item. These spaces must remain safe, in particular even if a flammable refrigerant escapes from the containers and lines provided for it, for example in the event of leakage, damage or malfunction.

The present invention is based on the technical problem of improving the operational safety of cooled laboratory equipment cooled by means of a flammable refrigerant. In particular, another technical problem underlying the present invention is to avoid and preferably eliminate, at least temporarily during critical operating phases, the occurrence of ignition sparks within the equipment which may ignite the flammable refrigerant.

In particular, it may be provided that at the start of operation of the laboratory equipment, an inner region is first ventilated by means of a fan in order to blow any flammable refrigerant present out from the inner region, in particular into the environment. The ventilated inner region is in particular a region in which ignition sparks may occur. Until it is able to be assumed that there is no longer any flammable refrigerant in the inner region, the formation of ignition sparks must be precluded. This may be achieved in particular by separating the electrical devices inside the equipment from the electrical mains supply. The equipment therefore preferably has an electrical connection, the potentially current-carrying lines of which are all disconnectable from the electrical mains supply by at least one electrical switch. A protective conductor and/or a grounded line may be excluded from this. However, all phase lines and the neutral conductor are preferably each disconnectable from the mains supply by at least one electrical switch.

If it is now able to be assumed that even when the electrical power supply to the equipment is switched on, an ignition spark that occurs is unable to ignite an ignitable mixture with flammable refrigerant, then a process for switching on may be started. On the other hand, however, it should be possible to switch on reliably during this process and also, after switch-on, to monitor reliably whether the power supply is still present. This may reduce the probability of ignition sparks occurring after switch-on, for example by unintentional interruption of the power supply and then immediate restoration of the power supply. Alternatively, or additionally, by monitoring the presence of the power supply, operation of the laboratory equipment after switch-on may be carried out in such a way that ignition sparks are avoided or may only occur if no capable mixture is able to be ignited.

Particularly in conjunction with the ventilation of at least one inner region of the equipment, operational safety is therefore able to be increased if the presence of an operating voltage between electrical lines of the laboratory equipment is able to be reliably detected. Furthermore, this detection may be used to make the process of switching on the power supply of the equipment safe.

It is proposed to detect a switched-on state of an electrical switch when an electrical operating voltage is present between a first (electrical) contact and a second (electrical) contact and to signal this state. In this case, the first contact is on the equipment side of the electrical switch (i.e. when the switch is open, the switch disconnects the first contact from the electrical mains supply) and the second contact is connected on the mains side to a different electrical potential than the mains side of the electrical switch. The expression "connected on the mains side" means that, during the execution of the process for switching on the equipment, the second contact is not disconnected from the mains by any switch present in the individual electrical supply lines of the equipment. In particular, there is another switch of this kind on the equipment side of the second contact.

In this way, the presence of the electrical operating voltage on the equipment side of the electrical switch to be monitored is able to be reliably determined, because it is not dependent on the switched state of further electrical switches on the equipment side of the second contact in the supply lines. It is not possible to rule out here that the presence of the electrical operating voltage is dependent on the switched state of a further switch, namely a switch that is provided on the mains side of the second contact, for example as a main switch. During the process of switching on, however, such a main switch may be switched on first and this state during the process is therefore equivalent to the case in which no main switch is present.

If it is now signaled that the electrical switch to be monitored is in the particular state and this state is not the expected state, then this may be signaled and, in particular, an appropriate action taken. In particular, the presence of the electrical operating voltage or its absence may be signaled to a sequence controller of the laboratory equipment. The sequence controller is configured to switch on and/or switch off at least two electrical switches of an electrical switch arrangement of the laboratory equipment. At least one corresponding control sequence (i.e. a control process with more than one action) to be executed by the sequence controller requires at least one of the switches to be switched on and/or off. In particular, in the case of a single-phase power supply to the laboratory equipment, two switches may be present and controllable by the sequence controller: one in the single-phase line and one in the neutral line. In the case of a multi-phase power supply, there may be a switch in each of the phase lines and a switch in the neutral conductor (if present). In the case of a delta connection, there is no neutral conductor. Optionally, there may be not only a switch in at least one of the lines, but at least one further switch connected in series. This further switch may also be controllable by the sequence controller.

The expected state of the switch results in particular from the process to be controlled by the sequence controller. For example, if two electrical switches are to be switched on, the process assumes that both switches are initially switched off. At this stage of the process, it is therefore expected that the switched-off state is signaled. Preferably, the process provides that the switches are switched on one after the other. If a switch is connected to the neutral conductor of the power supply on the mains side, then this switch is preferably switched on first, provided that there is a clear and unchangeable assignment of the switches to the electrical lines of the power supply. This unchangeable assignment is not given, for example, if the laboratory equipment has a connection cable with a plug that may be plugged into a socket of a single-phase electrical mains supply, as is the case in Germany.

The sequence controller may therefore first check whether the switch is in the expected state using the signal transmitted to it about the switched state. If this is the case, in the next step of the process the sequence controller may switch on this switch and then check using the signal transmitted to it whether the switch is switched on. The sequence controller may then proceed to switch on the other switch, during which process it is able to check, using the signal transmitted to it, whether the other switch is in the switched-off state, as expected, before the switch-on. After the switch-on, the sequence controller may check, using the signal transmitted to it, whether the other switch is switched on.

In this exemplary embodiment, the sequence controller has to switch on two switches. In this case, but also if only one switch or more than two switches are to be switched on, it is preferred, as described, that the sequence controller checks, using the signal transmitted to it about the switched state of the switch before the switch in question is switched on, whether this switch is still switched off. Furthermore, the sequence controller may use the signal transmitted to it to check, after the switch-on, whether the switch is switched on. As already mentioned, the signal may be a permanently present signal, such as a signal with a defined signal level. However, the signal may also be a signal that is only present temporarily. In this case, the sequence controller registers the receipt of the signal, for example, and infers the corresponding switched state of the switch, also for a period of time in the future. The absence of a change of state at a signal input of the sequence controller may also be the signal. For example, the switched-on state of the switch may be signaled by the fact that a corresponding signal is present once or repeatedly or permanently at the assigned signal input of the sequence controller. If no such signal is present, the sequence controller may infer that the switch is switched off. It is preferred that, when the switch is switched on, a corresponding signal is permanently present at the signal input of the sequence controller assigned to this switch. If this signal is not present or, in another embodiment, if a corresponding other signal is present, this means for the sequence controller that the switch is switched on. The not only temporary but permanent, uninterrupted signaling of the particular switched state of the switch or at least one of the two switched states of the switch increases the safety during monitoring and thus also the safety of the operation of the laboratory equipment.

After the switch or switches have been successfully switched on, the sequence controller may output a signal. The signal may be a prerequisite for starting the operation of at least one electrical consumer of the laboratory equipment.

A process essential for the safety of the laboratory equipment is therefore the switch-on process for switching on the power supply, which must be carried out in particular at the start of operation of the laboratory equipment. However, this switch-on process may also be carried out after the start of operation, for example if the power supply was temporarily interrupted. In particular, during the switch-on process, the sequence controller controls the switching on of the electrical switches that are to be switched on to establish the power supply. However, this does not preclude the sequence controller from switching on and/or off at least one of the switches also during operation of the laboratory equipment. When it is said that the sequence controller switches a switch on or off, it means that the sequence controller performs a corresponding control process. For example, at least one of the switches may be configured as a relay and the sequence controller controls the relay by activating or deactivating the control circuit of the relay.

If a state of at least one of the switches that is not expected is signaled to the sequence controller, then the sequence controller may block the operation of the laboratory equipment. In particular, it may immediately switch off at least one of the electrical switches controllable by it and preferably all electrical switches of the laboratory equipment that serve to supply power to the laboratory equipment.

In particular, the following is proposed: an item of laboratory equipment with flammable refrigerant, wherein the laboratory equipment comprises: an electrical connection for supplying the laboratory equipment with electrical energy, wherein the laboratory equipment is connectable for its operation via the connection to at least two different electrical potentials of an electrical mains supply, an electrical switch arrangement having a first electrical switch for electrical separation from a first of the at least two different electrical potentials and having a second electrical switch for electrical separation from a second of the at least two different electrical potentials, a sequence controller configured to switch on the first electrical switch and the second electrical switch, a monitoring device for monitoring the electrical switch arrangement, wherein the monitoring device is connected via a first contact on the equipment side to the first electrical switch and via a second contact on the mains side to an electrical potential other than the first electrical potential, wherein the monitoring device is configured to determine a switched-on state of the first electrical switch when an electrical operating voltage is present between the first contact and the second contact and to signal this state to the sequence controller, wherein the sequence controller is configured, when the first electrical switch is expected to be switched off, but it is signaled by the monitoring device that the first electrical switch is switched on, or when the first electrical switch is expected to be switched on, but it is signaled by the monitoring device that the first electrical switch is switched off, to block operation of the laboratory equipment.

The following is further proposed in particular: a method for producing an item of laboratory equipment with flammable refrigerant, wherein the monitoring device and the sequence controller are configured as described above with respect to the laboratory equipment.

The following is also further proposed: a method for operating an item of laboratory equipment with flammable refrigerant, wherein the laboratory equipment has the features described above, wherein the monitoring device detects a switched-on state of the first electrical switch when an electrical operating voltage is present between the first contact and the second contact and signals this state to the sequence controller, and wherein the sequence controller, when the first electrical switch is expected to be switched off, but it is signaled by the monitoring device that the first electrical switch is switched on, or when the first electrical switch is expected to be switched on, but it is signaled by the monitoring device that the first electrical switch is switched off, blocks operation of the laboratory equipment.

An operating voltage is understood to be an electrical voltage that is provided for or at least sufficient for the operation of the laboratory equipment or at least one electrical device of the laboratory equipment (such as a centrifuge drive motor). In particular, it is an electrical voltage that is provided from outside the laboratory equipment by an electrical mains supply.

The aforementioned first electrical switch may be the only switch that is monitored for its switched state when the power supply is switched on. The first electrical switch may be, but does not have to be, the switch that is switched on first. Rather, in the case of a power supply with a phase line and a neutral conductor, it is preferred that at least the switch that is connected to the phase line on the mains side is monitored for its switched state. It is particularly preferred that all switches are monitored for their switched states and that the sequence controller takes this into account in the process of switching on the switches.

The first electrical switch or at least one of the electrical switches may be a relay or a controllable semiconductor switch, such as a transistor, for example a thyristor, a field-effect transistor and/or a transistor with an insulated gate, for example an IGBT. In principle, any controllable switch may be used. The electrical switches are therefore controllable electrical switches.

The signaling of the presence of the operating voltage by the monitoring device to the sequence controller may be carried out in different ways. For example, a corresponding signal in the form of a defined signal level may be generated permanently when the operating voltage is present. Alternatively, the occurrence of the operating voltage may only be signaled temporarily, for example by a pulse-shaped signal. Furthermore, the absence or non-generation of a defined signal may signal the presence of the operating voltage. The same applies for non-presence of the operating voltage. In particular, it is not necessary, although possible, that the presence of the operating voltage and the non-presence of the operating voltage are signaled by the same type of signal, such as a continuous signal with a high signal level for the presence of the operating voltage and a continuous signal with a low signal level for the non-presence of the operating voltage.

As mentioned, the process controlled by the sequence controller during which the first switch and the second switch are to be switched on may be a switch-on process for switching on the power supply to the laboratory equipment.

The blocking of the operation of the laboratory equipment by the sequence controller may be realized in different ways. In particular, at least one of the following measures or any expedient combination of these measures may be carried out: returning (resetting) the process controlled by the sequence controller to a defined state, in particular the initial state, not switching on further switches, switching off one or more switches, in particular all switches of the power supply, not releasing the operation of at least one and preferably all electrical consumers within the laboratory equipment, issuing a request to another controller and/or to a user to stop and/or not start the operation of the laboratory equipment.

In particular, the first and the second electrical switch may be switched on independently of each other, wherein the sequence controller is configured to switch on the first electrical switch and the second electrical switch one after the other at the start of operation of the laboratory equipment. If both switches are monitored for their switched state and the particular switched state is signaled to the sequence controller, the latter is able to monitor and execute the switch-on process with increased safety. If, on the other hand, both switches are switched on at the same time and/or if, before switching on the switch to be switched on later in the temporal sequence, it is not checked whether the switch to be switched on earlier is actually switched on and also whether the switch to be switched on later is not yet switched on, both switches may be switched on despite a fault or, in the case of a power supply with a phase line and a neutral conductor, the switch of the phase line may be switched on while the switch of the neutral conductor is not switched on. This may lead to an ignition spark. Also, the fault lie be in the monitoring of the switched states of the switches and this fault may be detected too late if the switches are switched on simultaneously. If then, in addition, at least one of the switches is defective, undesired switched states may occur. Such a switch-on process would therefore not be as safe as a switch-on process in which the switches are switched on one after the other and it is checked in each case on the basis of the signaling of their switched state before switching on and after switching on whether the expected switched state exists.

As mentioned, in particular at least two switches are provided which are to be switched on to switch on the power supply. Furthermore, as mentioned, it is preferred that at least one electrical switch is provided in each of the electrical lines of the laboratory equipment that are required for operation on the power supply. Thus, in the case of a power supply with a neutral conductor and a single-phase line, at least one switch is provided for each of these two lines. In the case of a power supply with more than one phase line, at least one switch is provided for each of the phase lines. When a preferred embodiment with a first and a second electrical switch is discussed hereinafter, this applies to all variants of power supplies.

It is preferred that the monitoring device is connected via a third contact on the equipment side to the second electrical switch and via a fourth contact on the mains side to an electrical potential other than the second electrical potential. In this case, the monitoring device is configured to determine a switched-on state of the second electrical switch when an electrical operating voltage is present between the third contact and the fourth contact and to signal this state to the sequence controller. Furthermore, the sequence controller is configured, when the second electrical switch is expected to be switched off, but it is signaled by the monitoring device that the first electrical switch is switched on, or when the second electrical switch is expected to be switched on, but it is signaled by the monitoring device that the first electrical switch is switched off, to block operation of the laboratory equipment. With regard to the method for operating the laboratory equipment, the sequence controller may be operated accordingly and may block the operation of the laboratory equipment in the cases mentioned.

In particular, the monitoring device and the sequence controller may optionally be configured in the same way with regard to monitoring and with regard to switching on the second electrical switch as with regard to the first electrical switch. As mentioned before, the second electrical switch may also be a switch that is switched on before the first electrical switch when the power supply of the laboratory device is switched on.

The aforementioned embodiment with the third contact and the fourth contact is a realization of the already mentioned preferred principle of monitoring of two switches.

The sequence controller may be configured, or may operate accordingly,
  to start a process for switching on the first electrical switch when the monitoring device signals to the sequence controller a first predefined state of the electrical switch arrangement which includes that the first electrical switch is switched off,
  then to check whether the switched-on state of the first electrical switch is signaled to the sequence controller by the monitoring device, and
  to block the operation of the laboratory equipment or to stop a process to be controlled by the sequence controller, if the switched-on state of the first electrical switch is not signaled to the sequence controller by the monitoring device.

Starting the process for switching on the first electrical switch may in particular be a control and/or triggering of the switch-on. The first predefined state may be determined solely by the switched state of the first electrical switch. Preferably, however, if in particular as already described above, more than one switch of the switch arrangement is monitored for its switched state, the first predefined state of the electrical switch arrangement is determined by the switched state of a plurality of the switches of the switch arrangement. Therefore, for example, if the first electrical switch is the switch to be switched on later in the sequence of two switches, the first predefined state requires that the other switch to be switched on earlier is already switched on. If, on the other hand, the first electrical switch is the switch to be switched on earlier in the sequence of two switches, the first predefined state requires that the other switch to be switched on later is switched off. In particular, as described above, the third and fourth contacts may be used to monitor the switched state of the second electrical switch.

In particular, for monitoring each electrical switch to be monitored with regard to the switched state, the monitoring device may have a detection device which is configured to detect the switched-on state of the electrical switch when the electrical operating voltage is present between the two contacts and to signal this state to the sequence controller. As will be described in greater detail below, the two contacts do not have to be a contact pair in which one of the contacts is arranged on the equipment side of the electrical switch and the other of the two contacts is arranged on the mains side, as already described above. Rather, in particular, the switched states of two electrical switches in different lines for the power supply (for example neutral conductor and phase line) of the laboratory equipment may also be monitored for the switched state by means of a single detection device. In this case, a distinction may only be made between the switched-on state of both switches on the one hand and another state on the other hand. The other state exists when at least one of the two switches is switched off.

In particular, it is preferred that in this way the two electrical switches are monitored for their switched state and additionally at least one of these two electrical switches is individually monitored (as already described) for its switched state. The monitoring means here that, as already mentioned several times, the corresponding state is signaled to the sequence controller and the latter preferably also takes the state into account when deciding whether the process to be controlled by it is to be continued. At least one of the switches is therefore redundantly monitored for its switched state. This allows the sequence controller to check the function of the monitoring device and to detect a malfunction. In particular, it is preferred that in the event of a malfunction, the process controlled by the sequence controller is interrupted by it, is aborted by it and/or the operation of the laboratory equipment is blocked by it.

The laboratory equipment may therefore be configured as follows, or may operate accordingly:
  the monitoring device has a first detection device which is configured to detect the switched-on state of the first electrical switch when the electrical operating voltage is present between the first contact and the second contact and to signal this state to the sequence controller,
  the monitoring device is connected to the first electrical switch via a fifth contact on the equipment side and to the second electrical switch via a sixth contact on the equipment side,
  the monitoring device has a third detection device which is configured to detect a switched-on state of the first electrical switch and the second electrical switch when the electrical operating voltage is present between the fifth contact and the sixth contact and to signal this state to the sequence controller, and
  the sequence controller is configured to block the operation of the laboratory equipment or to stop a process controlled by it if, after switching on the first electrical switch and the second electrical switch, the particular switched-on state is not signaled to it both by the first detection device and by the third detection device.

In particular, the sequence controller may also check whether the particular switched-on state is signaled to it by the first detection device and by the third detection device within a predefined period of time. If this is not the case, the sequence controller may block the operation of the laboratory equipment or stop the process controlled by it. In this way, malfunctions of the monitoring device in particular may be noticed by the sequence controller.

In particular, a second detection device may also be provided which is configured to detect the switched-on state of the first electrical switch when the electrical operating voltage is present between the third contact and the fourth contact and to signal this state to the sequence controller. In this case, the sequence controller may block the operation of the laboratory equipment or stop a process controlled by it if, after the first electrical switch and the second electrical switch have been switched on, the switched-on state is not signaled to it both by the first detection device and by the second detection device and also by the third detection device. This makes checking the monitoring device for faults even more reliable.

The monitoring device may include at least one device comprising at least one bistable flip-flop. At least while the bistable flip-flop is connected to its power supply, one of two possible states of the flip-flop is maintained stable until the conditions for a change of state have occurred. Common bistable flip-flops have a data input and a trigger input. When a trigger signal is received at the trigger input, such as a change in the level of the input signal at the trigger input, the change of state may occur provided a corresponding change in the data signal also occurs at the data input. In particular, the data signal as applied at the data input (or inverted in another embodiment) may then be connected through to the output of the bistable flip-flop.

It is preferred that the logic available for the process control within the sequence controller is realized by hardware and preferably exclusively by hardware. Hardware of logic circuits may consist in particular of logic gates, bistable flip-flops and Schmitt triggers as well as classic electrical components such as resistors, capacitors and diodes. The advantage of hardware logic over software logic is that it is not necessary to apply for re-approval, as is usually the case with software updates. If the hardware logic meets the requirements and fulfils its function, no update is required.

In particular, the aforementioned process for switching on the power supply of the laboratory equipment may be implemented at least partially by hardware logic of the sequence controller. According to one embodiment, the sequence controller has an electronic circuit with a bistable flip-flop, wherein the bistable flip-flop is connected on the input side to a first signal line via which the monitoring device signals to the bistable flip-flop that the first electrical switch is switched on. On the output side, the bistable flip-flop is connected to a second signal line via which the bistable flip-flop signals, depending on a signal transmitted via the first signal line and depending on a further signal, that the switch-on process for switching on the laboratory equipment may be continued by the sequence controller or that the switch-on process was successful.

The further signal is in particular the signal that is present or applied at the trigger input in the above-described realization of the bistable flip-flop. Without the trigger signal, the signal present at the first signal line, the data line, is not sent (unchanged or inverted) to the output. In general, not only with reference to the embodiment with the data input and the trigger input, the further signal may depend on the presence or existence of a start signal for starting the process to be controlled by the sequence controller and/or on the generation of a signal signaling the successful execution of a preceding process step (for example a step of switching on another electrical switch).

The bistable flip-flop is an essential logic element with regard to the process sequence. In particular, the evaluation of the signals of the above-mentioned detection devices may be realized in this way. In this case, the realization then does not refer to the first electrical switch, but to the second electrical switch or to two electrical switches to be monitored jointly by means of a single detection device. Therefore, the bistable flip-flop may be connected on the input side to a first signal line via which the monitoring device signals to the bistable flip-flop that the first electrical switch and the second electrical switch are switched on.

In an advantageous embodiment, the further signal (in particular the signal at the trigger input) also depends on the switched-on state of the first electrical switch being signaled to the bistable flip-flop by the monitoring device. Therefore, if the switched-on state is not signaled to the monitoring device, this prevents the bistable flip-flop from signaling at its output that the switch-on process for switching on the laboratory equipment may be continued by the sequence controller or that the switch-on process was successful. The bistable flip-flop therefore only signals that the switch-on process for switching on the laboratory equipment may be continued by the sequence controller or that the switch-on process was successful if the first switch is actually switched on. This avoids errors of the sequence controller that could occur in the event of a defect of the switch to be switched on and also a defect of the bistable flip-flop. In particular, the defect of the bistable flip-flop may lie in the fact that the presence of the signal which signals the switched-on state of the electrical switch is permanently detected at the data input. In the case of the above-described embodiment with trigger input, a defective switch prevents the bistable flip-flop from receiving the trigger signal that allows the output of the signal at its signal output.

According to a further embodiment, the sequence controller may comprise a test device comprising a simulation device configured to simulate that the first electrical switch is not switched on when the simulation device is activated for a control process of the sequence controller to be executed for switching on the first electrical switch. As mentioned, the electrical switch need not be the electrical switch that is switched on first. It may also be simulated for a plurality of the electrical switches that the switch in question is not switched on. The test device is configured to check, when the simulation device is activated, whether the sequence controller releases operation of the laboratory equipment after a run-through of the control process. The test device then signals an error of the sequence controller if the sequence controller, with the simulation device activated, comes to the conclusion that the prerequisites for releasing operation of the laboratory equipment are fulfilled. In particular, the signaling of the error might result in the operation not being released. If the sequence controller is realized by hardware logic, the test device may be realized, for example, by additional logic gates. If, for example, a test signal is then provided at one or more of the logic gates at the start of a control process to be executed by the sequence controller, this activates the simulation.

The invention is described in this description in relation to an item of laboratory equipment with flammable refrigerant. Although not within the scope of the appended claims, the invention may also be applied to other equipment and devices, particularly those also comprising flammable refrigerants. This means that the switch arrangement, the monitoring device and the sequence controller are also present in the embodiments described in this description.

SUMMARY OF THE DISCLOSURE

In one implementation, the present disclosure is directed to an item of laboratory equipment with flammable refrigerant, wherein the laboratory equipment includes an electrical connection for supplying the laboratory equipment with electrical energy, wherein the laboratory equipment is connectable for its operation via the connection to at least two different electrical potentials of an electrical mains supply, an electrical switch arrangement having a first electrical switch for electrical separation from a first of the at least two different electrical potentials and having a second electrical switch for electrical separation from a second of the at least two different electrical potentials, a sequence controller configured to switch on the first electrical switch and the second electrical switch, a monitoring device for monitoring the electrical switch arrangement, wherein the monitoring device is connected via a first contact on the equipment side to the first electrical switch and via a second contact on the mains side to an electrical potential other than the first electrical potential, wherein the monitoring device is configured to determine a switched-on state of the first electrical switch when an electrical operating voltage is present between the first contact and the second contact and to signal this state to the sequence controller, wherein the sequence controller is configured, when the first electrical switch is expected to be switched off, but it is signaled by the monitoring device that the first electrical switch is switched on, or when the first electrical switch is expected to be switched on, but it is signaled by the monitoring device that the first electrical switch is switched off, to block operation of the laboratory equipment.

In another implementation, the present disclosure is directed to a method for operating an item of laboratory equipment with flammable refrigerant, wherein the laboratory equipment includes an electrical connection for supplying the laboratory equipment with electrical energy, wherein the laboratory equipment is connectable for its operation via the connection to at least two different electrical potentials of an electrical mains supply, an electrical switch arrangement having a first electrical switch for electrical separation from a first of the at least two different electrical potentials and having a second electrical switch for electrical separation from a second of the at least two different electrical potentials, a sequence controller configured to switch on the first electrical switch and the second electrical switch, a monitoring device for monitoring the electrical switch arrangement, wherein the monitoring device is connected via a first contact on the equipment side to the first electrical switch and via a second contact on the mains side to an electrical potential other than the first electrical potential, wherein the monitoring device is configured to determine a switched-on state of the first electrical switch when an electrical operating voltage is present between the first contact and the second contact and to signal this state to the sequence controller, and wherein the sequence controller, when the first electrical switch is expected to be switched off, but it is signaled by the monitoring device that the first electrical switch is switched on, or when the first electrical switch is expected to be switched on, but it is signaled by the monitoring device that the first electrical switch is switched off, blocks operation of the laboratory equipment.

In yet another implementation, the present disclosure is directed to a method for producing an item of laboratory equipment with flammable refrigerant, wherein the following are provided: an electrical connection for supplying the laboratory equipment with electrical energy, wherein the laboratory equipment is connectable for its operation via the connection to at least two different electrical potentials of an electrical mains supply, an electrical switch arrangement having a first electrical switch for electrical separation from a first of the at least two different electrical potentials and having a second electrical switch for electrical separation from a second of the at least two different electrical potentials, a sequence controller configured to switch on the first electrical switch and the second electrical switch, a monitoring device for monitoring the electrical switch arrangement, wherein the monitoring device is connected via a first contact on the equipment side to the first electrical switch and via a second contact on the mains side to an electrical potential other than the first electrical potential, wherein the monitoring device is configured to determine a switched-on state of the first electrical switch when an electrical operating voltage is present between the first contact and the second contact and to signal this state to the sequence controller, wherein the sequence controller is configured such that, when the first electrical switch is expected to be switched off, but it is signaled by the monitoring device that the first electrical switch is switched on, or when the first electrical switch is expected to be switched on, but it is signaled by the monitoring device that the first electrical switch is switched off, it blocks operation of the laboratory equipment.

BRIEF DESCRIPTION OF THE DRAWINGS

For the purpose of illustrating the disclosure, the drawings show aspects of one or more embodiments of the disclosure. However, it should be understood that the present disclosure is not limited to the precise arrangements and instrumentalities shown in the drawings, wherein.

DETAILED DESCRIPTION

Figure 1:
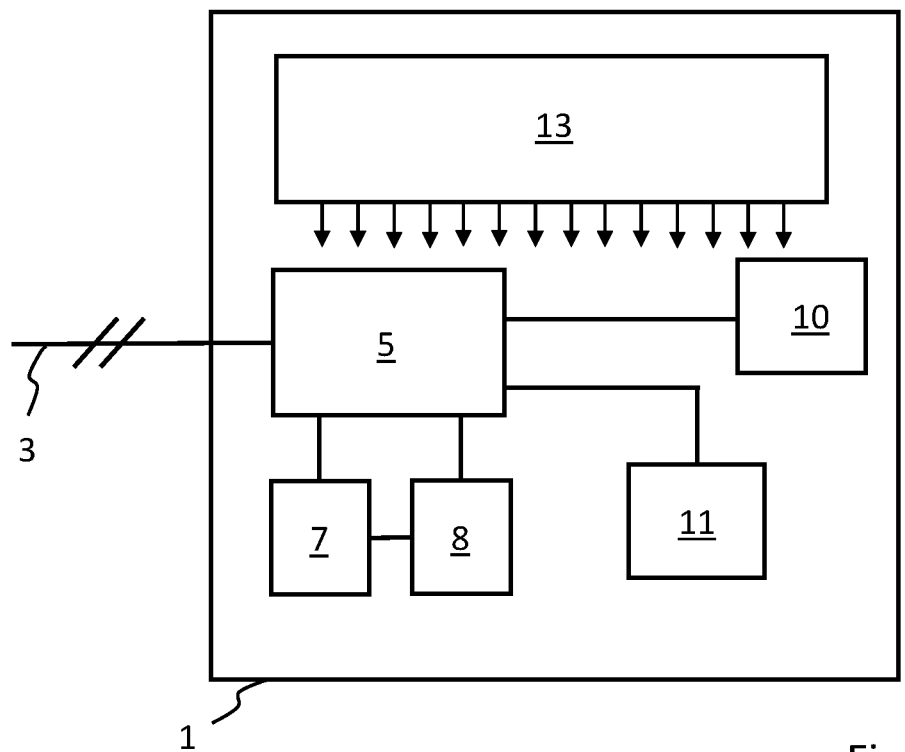
FIG. 1 shows schematically an item of laboratory equipment with an electrical connection and with a cooling device that uses a flammable refrigerant.

The item of laboratory equipment 1 shown schematically in FIG. 1 has an electrical connection 3 which has two electrical lines as indicated by two diagonal strokes. In particular, these may be a neutral conductor and a phase line. Alternatively, the laboratory device may have an electrical connection with more than one phase line, for example a three-phase connection.

The item of laboratory equipment 1 also has an electrical switch arrangement 5. By switching on switches, not shown in FIG. 1, of the switch arrangement 5, devices 10, 11 to be supplied with electrical energy, such as a centrifuge motor and a centrifuge controller, may be connected to the external power supply.

The electrical switch arrangement 5 is combined with a monitoring device 7 and a sequence controller 8. The monitoring device 7 is used to monitor the electrical switch arrangement 5. The sequence controller 8 is used to control at least one process which is to be carried out at the start of and/or during operation of the laboratory equipment 1. In particular, the processes to be controlled by the sequence controller 8 relate exclusively to the electrical power supply of devices of the laboratory equipment. During its operation, the sequence controller 8 receives signals from the monitoring device 7.

Furthermore, the laboratory equipment 1 has a cooling device 13 which uses a flammable refrigerant. The cooling effect generated during operation of the cooling device 13 is indicated by a number of downwardly pointing arrows. The cooling device 13 may also be supplied with electrical energy from the external power supply via the switch arrangement 5, for which purpose the electrical switches of the switch arrangement 5 must be switched on. By contrast, the monitoring device 7 and the sequence controller 8 are supplied with electrical energy independently of the switched state of the switches of the switch arrangement 5. A separate power supply may be provided for this purpose, but energy is preferably supplied also from the mentioned external power supply.

Figure 2:
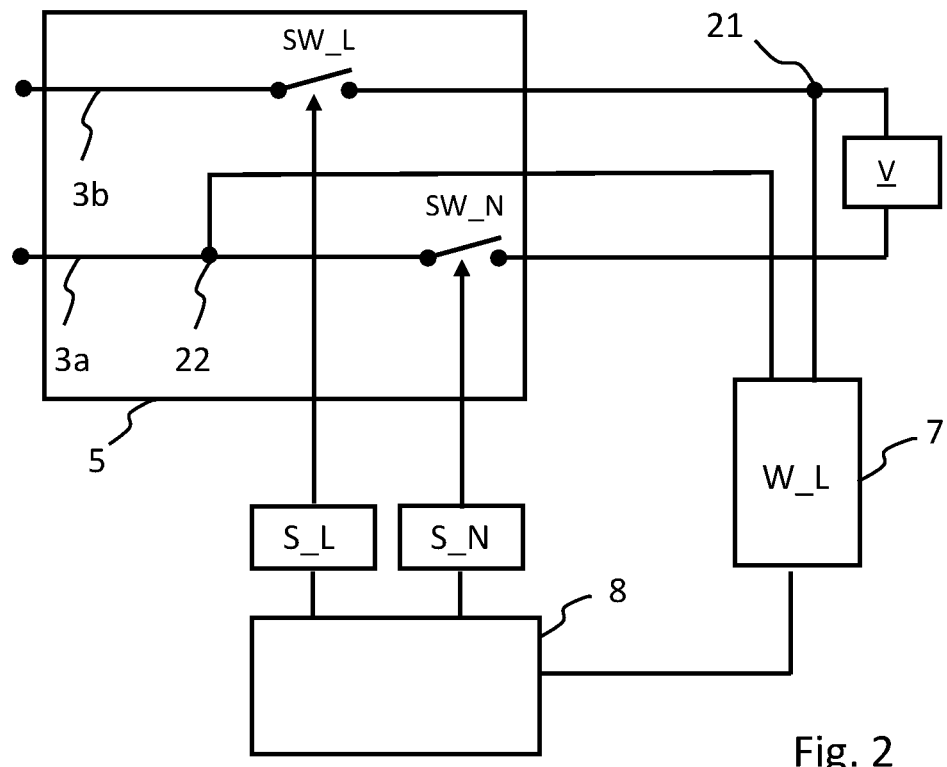
FIG. 2 shows a first exemplary embodiment of an electrical switch arrangement, a monitoring device and a sequence controller.

FIG. 2 shows a first exemplary embodiment of the electrical switch arrangement 5 from FIG. 1 or a corresponding switch arrangement of another item of laboratory equipment. The external power supply and thus also the switch arrangement 5 have a first electrical line 3a (for example a neutral conductor N) and a second electrical line 3b (for example a phase line). For example, the external power supply may be operated on a public mains electrical supply with the available voltage and mains frequency, which in Germany, for example, are nominally 230 V and 50 Hz.

An electrical switch SW_N is arranged in the first electrical line 3a. A further electrical switch SW_L is arranged in the second electrical line 3b. When a switch is open, the devices to be supplied by the external power supply during operation of the laboratory equipment are disconnected from the power supply and therefore are unable to be operated. For their operation, both electrical switches SW_N, SW_L must be switched on.

In the exemplary embodiment, the monitoring device 7 has a single detection device W_L which is configured to monitor the switched state of the switch SW_L in the second electrical line 3b. The detection device W_L is connected on the equipment side to the electrical switch SW_L in the second electrical line 3b via a first contact 21 and on the mains side to an electrical potential other than the electrical potential of the second electrical line 3b via a second contact 22. This other electrical potential is the electrical potential of the first electrical line 3a. The second contact 22 is therefore located on the mains side of the electrical switch SW_N in the first electrical line 3a. The detection device W_L comprises, for example, an optocoupler, as do also the detection devices of other embodiments. Therefore, if the electrical operating voltage is present between the contacts 21, 22, the optocoupler generates a corresponding signal which signals the switched-on state of the switch SW_L in the second electrical line 3b. This signal is fed to the sequence controller 8. The electrical operating voltage is only present between the contacts 21, 22 when the switch SW_L in the second electrical line 3b is switched on. Otherwise, the electrical potential at the first contact 21 is not at the potential of the phase line of the external power supply.

The sequence controller 8 controls the switching on of the two electrical switches SW_N, SW_L via one actuator S_N, S_L each. The control circuit of each switch, for example the control circuit of a relay, is activated by the actuators under appropriate control by the sequence controller 8.

Figure 3:
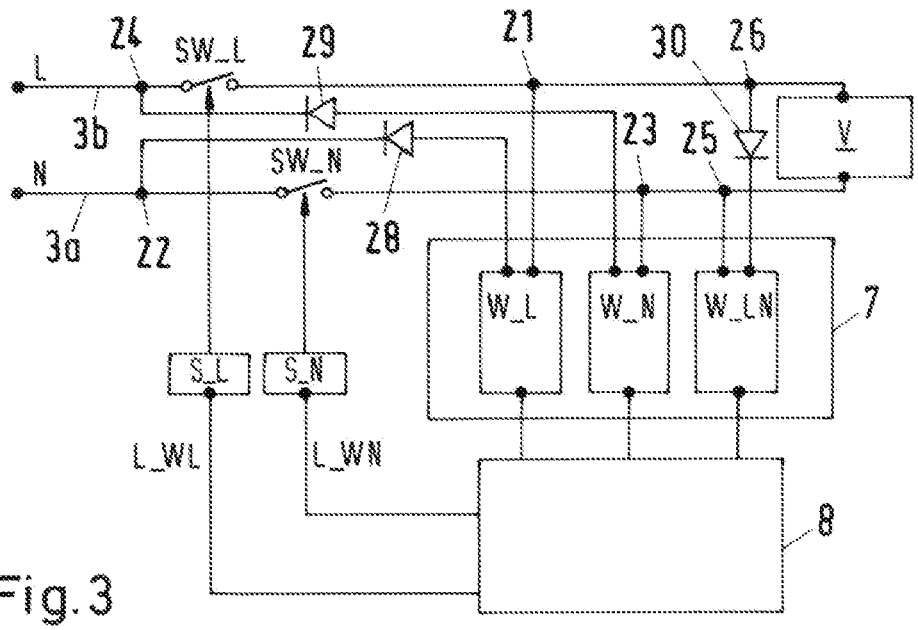
FIG. 3 shows a second exemplary embodiment of an electrical switch arrangement, a monitoring device and a sequence controller.

FIG. 3 shows a second exemplary embodiment of the electrical switch arrangement 5 from FIG. 1 or a corresponding switch arrangement of another item of laboratory equipment. This exemplary embodiment may be used with the same power supply with two supply lines 3a, 3b, as in the cases of FIG. 1 and FIG. 2. For example, the supply lines are again a phase conductor and a neutral conductor, as indicated by the letters L, N.

Compared to the first exemplary embodiment from FIG. 2, the monitoring device 7 is extended by two further detection devices W_N and W_LN. The detection device W_L is present as in FIG. 1 and has the same contacts 21, 22 to the supply lines 3a, 3b. However, a diode 28 is additionally arranged in the connection line of the detection device W_L and, together with two further diodes 29, 30 in the connection lines of the two further detection devices W_N and W_LN to the second supply line 3b, prevents an unintentional current flow from occurring via a chain of connection lines between the two supply lines 3a, 3b. To prevent this unintended current flow, the one further diode 30 may also be omitted. However, its use is preferred in order to achieve symmetry in the circuit arrangement. Since in the exemplary embodiment an alternating current supply is provided, a current flow therefore takes place via the connection lines in the particular switched-on state of the switch or switches only in one half-wave of each cycle of the supply voltage. However, this is sufficient for the detection devices W_L, W_N and W_LN (which are each realised again by an optocoupler, for example) to detect the switched-on state.

The detection device W_N is connected on the equipment side via its two connection lines to a third contact 23 to the first supply line 3a and on the mains side to a fourth contact 24 to the second supply line 3b. It is thus configured to detect the switched state of the electrical switch SW_N in the first supply line 3a.

The detection device W_LN is connected on the equipment side via its two connection lines to a fifth contact 25 to the first supply line 3a and on the equipment side to a sixth contact 26 to the second supply line 3b. It is thus configured to determine the switched state of both switches: of the electrical switch SW_N in the first supply line 3a and of the electrical switch SW_L in the second supply line 3b. As already described above, it is only able to determine whether both switches are switched on or at least one of the two switches is switched off. The function and advantages of such an additional detection device have already been discussed.

Figure 4:
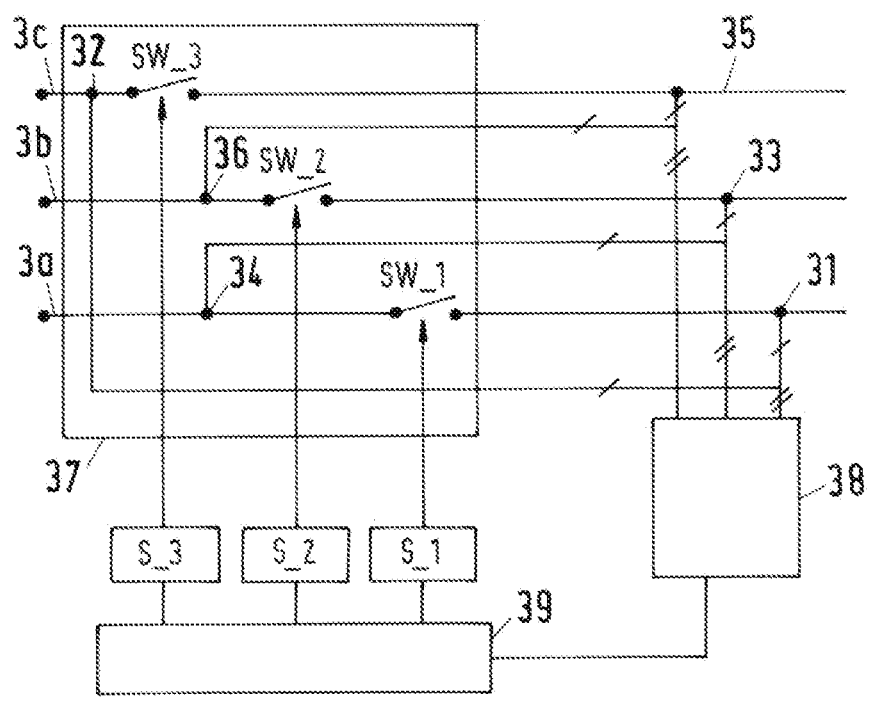
FIG. 4 shows a third exemplary embodiment of an electrical switch arrangement, a monitoring device and a sequence controller.

FIG. 4 shows a third exemplary embodiment of an electrical switch arrangement 37 of an item of laboratory equipment, wherein the electrical switch arrangement 37 differs from the electrical switch arrangement 5 from FIG. 1, as the electrical power supply has three phase lines 3a, 3b, 3c. The switch arrangement 37 comprises switches SW_1, SW_2 and SW_3 provided one in each of the three phase lines. The sequence controller 39 controls the switching on of the three electrical switches via an actuator S_1, S_2, S_3, respectively. The control circuit of each switch, for example the control circuit of a relay, is activated by the actuators under appropriate control by the sequence controller 39.

The illustration is simplified compared to the illustration of the second exemplary embodiment of the electrical switch arrangement 5 from FIG. 3. In particular, the diodes in the connection lines of the monitoring device 38 to the electrical supply lines are not shown, although they are present as also in the case of FIG. 3. This improves the clarity of the illustration. Furthermore, the connection lines of the monitoring device 38 are also shown in part by a single line for the sake of clarity, although there are two connection lines. This is represented by two diagonal strokes parallel to one another. Where the line represents only one connection line, a single diagonal stroke is drawn.

In the third exemplary embodiment, the monitoring device 38 has three detection devices which are not shown individually for reasons of clarity. Each of these detection devices is connected via its connection lines to two contacts in the three supply lines 3a, 3b, 3c, namely to a contact on the equipment side of the switch in the supply line and a contact on the mains side in another supply line. For example, a first of the detection devices is connected to the first supply line 3a via a first contact 31 on the equipment side of switch SW_1 and is connected to the third supply line 3c via a second contact 32 on the mains side of the third switch SW_3.

Optionally, at least one further detection device may be provided which is able to detect the common switched-on state of two of the three switches. This further detection device would be connected to the two switches to be monitored via a contact on the equipment side.

Alternatively, or additionally, the arrangement shown in FIG. 4 may be extended in the case of a three-phase power supply with neutral conductor by a detection device which is able to detect the switched-on state of a switch in the neutral conductor.

Figure 5:
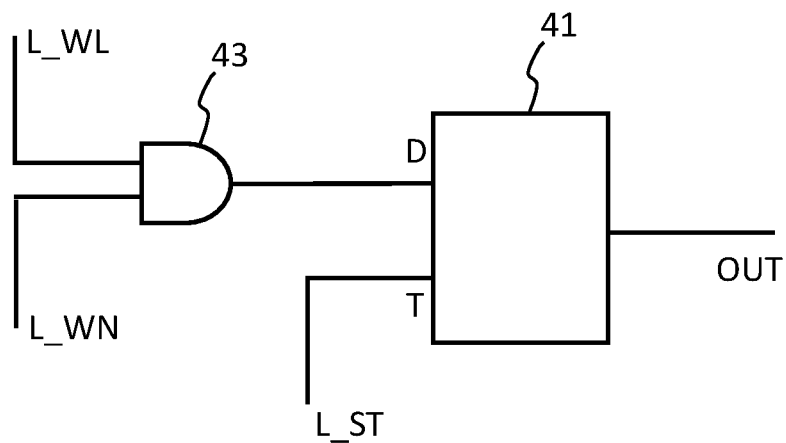
FIG. 5 shows a first circuit arrangement with a bistable flip-flop.

The circuit shown in FIG. 5 may be part of a sequence controller logic implemented in hardware, for example for the sequence controller in one of the previously described embodiments. The circuit comprises a logic gate 43 and a bistable flip-flop 41. The bistable flip-flop 41 has a data input D and a trigger input T. It also has an output OUT for outputting its output signal.

In the exemplary embodiment shown, two input signals L_WN and L_WL are fed to the logic gate 43. The input signal L_WN indicates, for example, the switched state of the electrical switch SW_N in the first supply line 3a of the exemplary embodiment from FIG. 2 or FIG. 3. The input signal L_WL indicates, for example, the switched state of the electrical switch SW_L in the second supply line 3b of the exemplary embodiment from FIG. 3. By means of additional circuit elements, not shown, such as further logic gates and/or Schmitt triggers, the input signals L_WN and L_WL may be linked to each other in different ways and/or linked to further signals before being fed to the inputs of the logic gate, depending on the embodiment of the circuit. All signals are preferably signals with two possible states, for example a state with low signal level and a state with high signal level. In this way, a binary logic may be realised.

For example, in the embodiment described below, the input signals L_WN and L_WL are linked and the logic gate 43 is configured such that the logic gate 43 outputs a signal with high signal level when both input signals L_WN and L_WL have the low signal level. The low signal level of the input signals L_WN and L_WL means in this case that the switches are switched off. Alternatively, the input signals L_WN and L_WL are linked, for example, and the logic gate 43 is configured so that the logic gate 43 outputs a signal with high signal level when both input signals L_WN and L_WL have the high signal level. In this case, the high signal level of the input signals L_WN and L_WL means that the switches are switched off. To achieve this, the signals generated by the detection devices that indicate the switched state of the switch in question may be inverted, for example.

In the embodiment described here, a start signal L_ST may be supplied to the logic gate 43, in particular at the start of a process controlled by the sequence controller for switching on the two electrical switches, wherein the start signal consists of the low signal level at the trigger input T of the bistable flip-flop 41 changing to the high signal level. Before the start signal is received, the output OUT of the bistable flip-flop 41 is at the low signal level. The start signal L_ST allows the input signal at the data input D of the bistable flip-flop 41 to be connected through to its output OUT. Since, as described, the logic gate 43 outputs a signal with a high signal level to the data input D when both switches are switched off, and since the high signal level at the output OUT is interpreted as meaning that the expected state of the switch arrangement consists of the first switch and the second switch, a logic circuit is realized which checks the switched-off state of both switches. If the check is successful, i.e., the high signal level is present at the output OUT of the bistable flip-flop 41, this triggers the next step in the process controlled by the sequence controller.

Such a next step or a step to be performed later in the process will now be described with reference to the circuit shown in FIG. 6. This circuit differs from the one shown in FIG. 5 merely in that the bistable flip-flop is denoted by the reference sign 51 and the logic gate is denoted by the reference sign 53. Furthermore, the bistable flip-flop 51 is supplied with a signal L_T at its trigger input. This is generally understood to mean a trigger signal, i.e. a signal which allows the bistable flip-flop 53 to change the state of its output signal at the output OUT in accordance with the input signal currently present at the data input D.

For the execution of the next step, the input signals L_WN and L_WL, before being supplied to the inputs of the logic gate 53, may be conditioned or received unchanged from the corresponding detection device and passed through to the logic gate 53 in such a way that the input signal L_WN has the high signal level when the switch in the first supply line is switched on and the input signal L_WL has the high signal level when the switch in the second supply line is switched off. Furthermore, the logic gate 53 is configured to output the signal with the high signal level when both input signals have the high signal level.

The trigger signal L_T is generated, for example, depending on the output signal at the output OUT of the bistable flip-flop 41 from FIG. 5. Alternatively, or additionally, the trigger signal L_T may be triggered when a detection device that detects the switched state of at least one of the electrical switches outputs a corresponding signal. Thus, in particular, the signal change from low to high signal level described above in relation to FIG. 5, or a signal change of another device indicating a corresponding state change, may trigger the possible signal change at the output OUT of the bistable flip-flop 51 from FIG. 6. If at this moment the high signal level is present at the data input D of the bistable flip-flop 51, i.e., the switch in the first supply line is switched on and the switch in the second supply line is switched off, then the signal change at the output OUT of the bistable flip-flop 51 from the previously existing low signal level to the high signal level takes place. In this way, it may be detected that the switch in the first supply line has been switched on in the meantime.

Previously, the term "next step" was used in the process controlled by the sequence controller. This referred to the next step in the checking of the state of the switch arrangement. However, it was also mentioned that in the meantime the switch in the first supply line was switched on. In the overall process of control, this may be referred to as the next step. In this case, the step of the process described in FIG.

5 would be the next-but-one step or a later step if other steps are carried out in the meantime.

Figure 6:
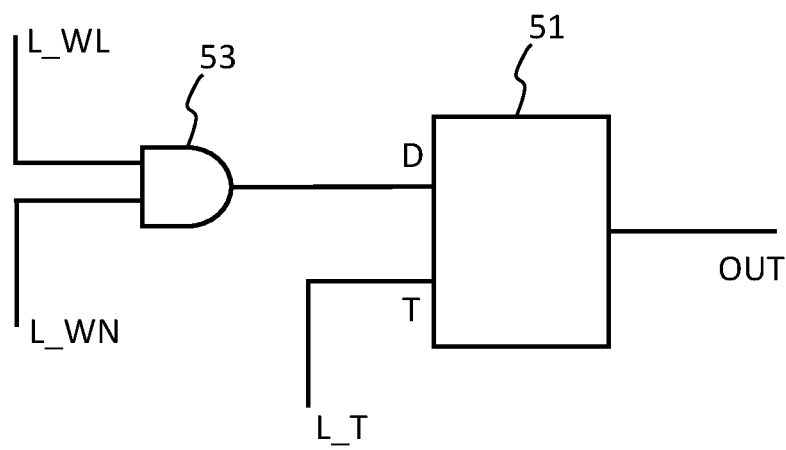
FIG. 6 shows a second circuit arrangement with a bistable flip-flop.

In order to effect the change of the signal level at the output OUT of the bistable flip-flop 51 from FIG. 6 at the right time, the trigger signal L_T may enter at the trigger input T in a delayed fashion. This is achieved, for example, with classic circuit components such as electrical resistors, capacitors and diodes. The use of such circuit components for this purpose is generally known and is therefore not described in detail here. Due to the delay, the electrical switch in the first supply line may be switched on beforehand, for example. The switching process requires a corresponding time period to which the delay of the trigger signal L_T is set.

Figure 7:
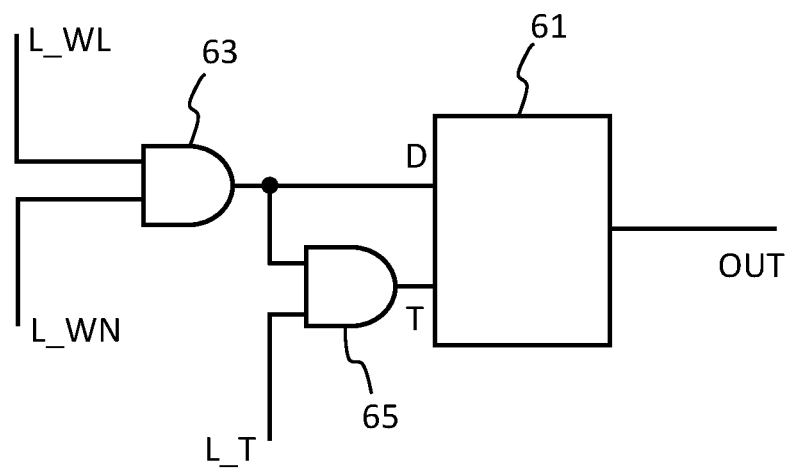
FIG. 7 shows a third circuit arrangement with a bistable flip-flop.

FIG. 7 shows a modification of the circuit shown in FIG. 6. The output of the logic gate 63 is connected to one input of an additional logic gate 65. The other input of the additional logic gate 65 is connected to the signal line for the trigger signal L_T. The output of the additional logic gate 65 is connected to the trigger signal input T.

Thus, the signal at the trigger input T in the embodiment described above with reference to FIG. 6 is also dependent on the monitoring device having signaled to the bistable flip-flop 61 the switched-on state of the electrical switch to be monitored. The bistable flip-flop therefore only signals that the step of switching on the electrical switch was successful if the switch was actually switched on. The errors that may be excluded by this have already been described. Therefore, in the event of these errors, the output signal of the bistable flip-flop 61 is not erroneously set to the high signal level and is prevented from erroneously continuing the process.

However, the principle of the circuit shown in FIG. 7 is not limited to checking the switching on of the switch in the first supply line. Rather, any checking of an expected state occurring within the hardware logic may be carried out in this way. Furthermore, the logic gates may have additional inputs, so that in particular the signal at the trigger input T may also still depend on the signal states of other signals. Furthermore, as with the circuits described above with reference to FIG. 5 and FIG. 6, the signal levels on the input side of the bistable flip-flop may be selected differently in the case of the expected state and/or the output signal of the bistable flip-flop may signal at a low signal level that the expected state has been detected.

Figure 8:
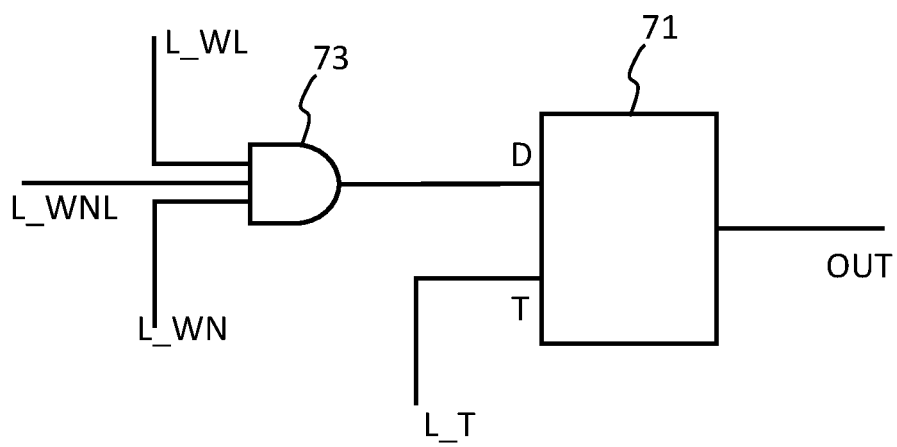
FIG. 8 shows a fourth circuit arrangement with a bistable flip-flop.

FIG. 8 shows a further modification of the circuits described so far. This modification may also be provided in addition to the modifications already described. The modification shown in FIG. 8 is that the logic gate 73, the output of which is connected to the data input D of the bistable flip-flop 71, receives three input signals L_WN, L_WL and L_WNL. These may be the signals (optionally linked with further signals and/or inverted) relating to the switched states of the switches, which in the case of the circuit arrangement of FIG. 3 are generated by the detection devices.

In particular, depending on the embodiment and/or preprocessing of the signals with regard to the switched states, the modification of FIG. 8 makes it possible to check whether all three detection devices signal in agreement that both switches are switched off, two of the three detection devices signal in agreement that a particular switch (either the first switch or the second switch) is switched on, all three detection devices signal in agreement that both switches are switched on.

Figure 9:
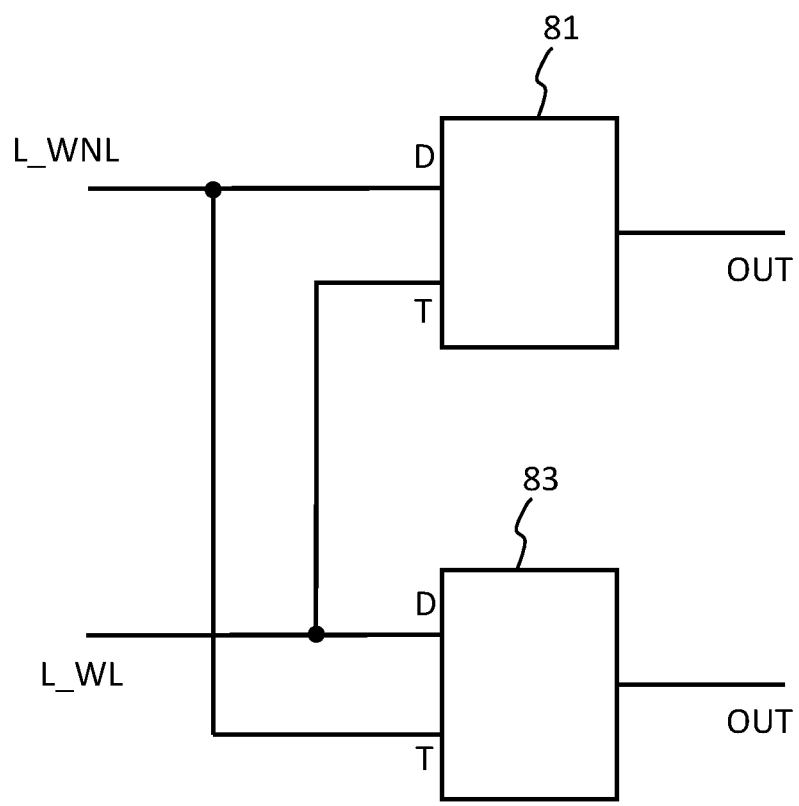
FIG. 9 shows a circuit arrangement with two bistable flip-flops.

Preferably, however, in particular the check as to whether the detection devices signal in agreement that one switch or both switches are switched on is not carried out or is only carried out with a circuit as shown in FIG. 8. Rather, a circuit that corresponds to the circuit principle shown in FIG. 9 is preferred. The circuit shown in FIG. 9 is simplified. In particular, the logic gates are omitted and only two bistable flip-flops 81, 83 are shown as hardware logic elements.

The circuit principle is to use the input signal for the data input of one bistable flip-flop as the input signal for the trigger input of the other bistable flip-flop, and vice versa. One input signal is therefore fed via a signal line to the data input D of one bistable flip-flop and to the trigger input T of the other bistable flip-flop. As mentioned, additional logic switching elements may be used, such as elements for inverting a signal. Furthermore, one of the two input signals in particular may be the output signal of a logic gate that logically links two primary input signals (such as the signals from two different detection devices of the monitoring device).

In the specifically illustrated exemplary embodiment, one input signal is, for example, a signal L_WL that represents the switched state of the switch in the second supply line 3*b* of FIG. 3, and the other input signal is, for example, a signal L_WNL that represents the switched state of the switches in the first and second supply lines 3*a*, 3*b* of FIG. 3. Alternatively, for example, the one input signal L_WL may be replaced in another embodiment by linking the signals that each represent the switched state of one of the two switches.

The change of the signal level of one of the signals triggers the possible change of the output signal of the corresponding bistable flip-flop. This circuit principle of FIG. 9 makes it possible to evaluate the redundant information of the various detection devices without errors. Redundant information in this sense exists in particular if, as in the case of FIG. 3, a detection device is provided for at least one electrical switch and signals the switched state of this switch alone, and a detection device is also provided which is able to signal the common switched-on state of two switches.

Preferably, a time tolerance between the presence of the two input signals (for example the signals L_WL, L_WNL) is also allowed. This may be achieved by the signal level change being delayed by the signal to be supplied to a trigger input T, as mentioned above, for example, using discrete circuit components such as at least one electrical resistor and a capacitor, as well as at least one diode for reducing the electrical voltage of the charged capacitor. The signal level change of the input signal thus initially causes the charging of the capacitor, which is then discharged again over time. At some point during the discharging process, the signal level change at the trigger input T then occurs.

The foregoing has been a detailed description of illustrative embodiments of the disclosure. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this disclosure. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present disclosure. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this disclosure.

Exemplary embodiments have been disclosed above and illustrated in the accompanying drawings. It will be understood by those skilled in the art that various changes, omissions and additions may be made to that which is specifically disclosed herein without departing from the spirit and scope of the present disclosure.

What is claimed is:

1. An item of laboratory equipment with flammable refrigerant, wherein the laboratory equipment comprises:
    an electrical connection for supplying the laboratory equipment with electrical energy, wherein the laboratory equipment is connectable for its operation via the connection to at least two different electrical potentials of an electrical mains supply,
    an electrical switch arrangement having a first electrical switch for electrical separation from a first of the at least two different electrical potentials and having a second electrical switch for electrical separation from a second of the at least two different electrical potentials,
    a sequence controller configured to switch on the first electrical switch and the second electrical switch,
    a monitoring device for monitoring the electrical switch arrangement, wherein the monitoring device is connected via a first contact on the equipment side to the first electrical switch and via a second contact on the mains side to an electrical potential other than the first electrical potential,
    wherein the monitoring device is configured to determine a switched-on state of the first electrical switch when an electrical operating voltage is present between the first contact and the second contact and to signal this state to the sequence controller,
    wherein the sequence controller is configured,
        when the first electrical switch is expected to be switched off, but it is signaled by the monitoring device that the first electrical switch is switched on, or
        when the first electrical switch is expected to be switched on, but it is signaled by the monitoring device that the first electrical switch is switched off,
    to block operation of the laboratory equipment.

2. The laboratory equipment according to claim 1, wherein the first and the second electrical switch may be switched on independently of each other, and wherein the sequence controller is configured to switch on the first electrical switch and the second electrical switch one after the other at the start of operation of the laboratory equipment.

3. The laboratory equipment according to claim 1, wherein the monitoring device is connected via a third contact on the equipment side to the second electrical switch and via a fourth contact on the mains side to an electrical potential other than the second electrical potential,
    wherein the monitoring device is configured to determine a switched-on state of the second electrical switch when an electrical operating voltage is present between the third contact and the fourth contact and to signal this state to the sequence controller,
    wherein the sequence controller is configured,
        when the second electrical switch is expected to be switched off, but it is signaled by the monitoring device that the first electrical switch is switched on, or
        when the second electrical switch is expected to be switched on, but it is signaled by the monitoring device that the first electrical switch is switched off,
    to block operation of the laboratory equipment.

4. The laboratory equipment according to claim 1, wherein the sequence controller is configured:
    to start a process for switching on the first electrical switch when the monitoring device signals to the sequence controller a first predefined state of the electrical switch arrangement which includes that the first electrical switch is switched off,
    then to check whether the switched-on state of the first electrical switch is signaled to the sequence controller by the monitoring device, and
    to block the operation of the laboratory equipment or to stop a process to be controlled by the sequence controller if the switched-on state of the first electrical switch is not signaled to the sequence controller by the monitoring device.

5. The laboratory equipment according to claim 1, wherein:
    the monitoring device has a first detection device which is configured to detect the switched-on state of the first electrical switch when the electrical operating voltage is present between the first contact and the second contact and to signal this state to the sequence controller,
    the monitoring device is connected to the first electrical switch via a fifth contact on the equipment side and to the second electrical switch via a sixth contact on the equipment side,
    the monitoring device has a third detection device which is configured to detect a switched-on state of the first electrical switch and of the second electrical switch when the electrical operating voltage is present between the fifth contact and the sixth contact and to signal this state to the sequence controller, and
    the sequence controller is configured to block the operation of the laboratory equipment or to stop a process controlled by it if, after switching on the first electrical switch and the second electrical switch, the particular switched-on state is not signaled to it both by the first detection device and by the third detection device.

6. The laboratory equipment according to claim 1, wherein the sequence controller comprises a test device comprising a simulation device configured to simulate that the first electrical switch is not switched on when the simulation device is activated for a control process of the sequence controller to be executed for switching on the first electrical switch,
    wherein the test device is configured to check, when the simulation device is activated, whether the sequence controller releases operation of the laboratory equipment after a run-through of the control process, and wherein the test device signals an error of the sequence controller when the sequence controller releases operation of the laboratory equipment with the simulation device activated.

7. The laboratory equipment according to claim 1, wherein the sequence controller has an electronic circuit with a bistable flip-flop, wherein the bistable flip-flop is connected on the input side to a first signal line, via which the monitoring device signals to the bistable flip-flop that the first electrical switch is switched on, and wherein the bistable flip-flop is connected on the output side to a second signal line via which the bistable flip-flop signals, depending on a signal transmitted via the first signal line and depending on a further signal, that the switch-on process for switching on the laboratory equipment may be continued by the sequence controller or that the switch-on process was successful.

8. The laboratory equipment according to claim 7, wherein the further signal also depends on the switched-on state of the first electrical switch being signaled to the bistable flip-flop by the monitoring device.

9. A method for operating an item of laboratory equipment with flammable refrigerant, wherein the laboratory equipment comprises:
an electrical connection for supplying the laboratory equipment with electrical energy, wherein the laboratory equipment is connectable for its operation via the connection to at least two different electrical potentials of an electrical mains supply,
an electrical switch arrangement having a first electrical switch for electrical separation from a first of the at least two different electrical potentials and having a second electrical switch for electrical separation from a second of the at least two different electrical potentials,
a sequence controller configured to switch on the first electrical switch and the second electrical switch,
a monitoring device for monitoring the electrical switch arrangement, wherein the monitoring device is connected via a first contact on the equipment side to the first electrical switch and via a second contact on the mains side to an electrical potential other than the first electrical potential,
wherein the monitoring device is configured to determine a switched-on state of the first electrical switch when an electrical operating voltage is present between the first contact and the second contact and to signal this state to the sequence controller,
and wherein the sequence controller,
when the first electrical switch is expected to be switched off, but it is signaled by the monitoring device that the first electrical switch is switched on, or
when the first electrical switch is expected to be switched on, but it is signaled by the monitoring device that the first electrical switch is switched off, blocks operation of the laboratory equipment.

10. The method according to claim 9, wherein the first and the second electrical switch may be switched on independently of each other, and wherein the sequence controller switches on the first electrical switch and the second electrical switch one after the other at the start of operation of the laboratory equipment.

11. The method according to claim 9, wherein the monitoring device is connected via a third contact on the equipment side to the second electrical switch and via a fourth contact on the mains side to an electrical potential other than the second electrical potential,
wherein the monitoring device determines a switched-on state of the second electrical switch when an electrical operating voltage is present between the third contact and the fourth contact and signals this state to the sequence controller,
wherein the sequence controller,
when the second electrical switch is expected to be switched off, but it is signaled by the monitoring device that the first electrical switch is switched on, or
when the second electrical switch is expected to be switched on, but it is signaled by the monitoring device that the first electrical switch is switched off, blocks operation of the laboratory equipment.

12. The method according to claim 9, wherein the sequence controller
starts a process for switching on the first electrical switch when the monitoring device signals to the sequence controller a first predefined state of the electrical switch assembly which includes that the first electrical switch is switched off,
then checks whether the switched-on state of the first electrical switch is signaled to the sequence controller by the monitoring device, and
blocks the operation of the laboratory equipment or stops a process to be controlled by the sequence controller if the switched-on state of the first electrical switch is not signaled to the sequence controller by the monitoring device.

13. The method according to claim 9, wherein
the monitoring device has a first detection device which detects the switched-on state of the first electrical switch when the electrical operating voltage is present between the first contact and the second contact and signals this state to the sequence controller,
the monitoring device is connected to the first electrical switch via a fifth contact on the equipment side and to the second electrical switch via a sixth contact on the equipment side,
the monitoring device has a third detection device which detects a switched-on state of the first electrical switch and of the second electrical switch when the electrical operating voltage is present between the fifth contact and the sixth contact and signals this state to the sequence controller, and
the sequence controller blocks the operation of the laboratory equipment or stops a process to be controlled by it if, after switching on the first electrical switch and the second electrical switch, the particular switched-on state is not signaled to it both by the first detection device and by the third detection device.

14. The method according to claim 9, wherein the sequence controller comprises a test device comprising a simulation device which simulates that the first electrical switch is not switched on when the simulation device is activated for a control process of the sequence controller to be executed for switching on the first electrical switch,
wherein the test device, with the simulation device activated, checks whether the sequence controller releases operation of the laboratory equipment after a run-through of the control process, and
wherein the test device signals an error of the sequence controller when the sequence controller releases operation of the laboratory equipment with the simulation device activated.

15. A method for producing an item of laboratory equipment with flammable refrigerant, wherein the following are provided:
- an electrical connection for supplying the laboratory equipment with electrical energy, wherein the laboratory equipment is connectable for its operation via the connection to at least two different electrical potentials of an electrical mains supply,
- an electrical switch arrangement having a first electrical switch for electrical separation from a first of the at least two different electrical potentials and having a second electrical switch for electrical separation from a second of the at least two different electrical potentials,
- a sequence controller configured to switch on the first electrical switch and the second electrical switch,
- a monitoring device for monitoring the electrical switch arrangement, wherein the monitoring device is connected via a first contact on the equipment side to the first electrical switch and via a second contact on the mains side to an electrical potential other than the first electrical potential, wherein the monitoring device is configured to determine a switched-on state of the first electrical switch when an electrical operating voltage is present between the first contact and the second contact and to signal this state to the sequence controller, wherein the sequence controller is configured such that,
- when the first electrical switch is expected to be switched off, but it is signaled by the monitoring device that the first electrical switch is switched on, or
- when the first electrical switch is expected to be switched on, but it is signaled by the monitoring device that the first electrical switch is switched off, it blocks operation of the laboratory equipment.

* * * * *